(12) United States Patent
Lee et al.

(10) Patent No.: US 9,601,552 B2
(45) Date of Patent: Mar. 21, 2017

(54) ORGANIC LIGHT EMITTING DISPLAY PANEL AND METHOD OF MANUFACTURING THE SAME

(71) Applicant: SAMSUNG DISPLAY CO., LTD., Yongin-si, Gyeonggi-Do (KR)

(72) Inventors: Duck Jung Lee, Yongin-si (KR); Jung Sun Park, Yongin-si (KR); Hyun Sung Bang, Yongin-si (KR); Ji Young Choung, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/991,373

(22) Filed: Jan. 8, 2016

(65) Prior Publication Data

US 2016/0336382 A1 Nov. 17, 2016

(30) Foreign Application Priority Data

May 11, 2015 (KR) ........................ 10-2015-0065454

(51) Int. Cl.
| | |
|---|---|
| *H01L 51/00* | (2006.01) |
| *H01L 27/32* | (2006.01) |
| *H01L 51/56* | (2006.01) |
| *H01L 51/52* | (2006.01) |
| *H01L 51/50* | (2006.01) |

(52) U.S. Cl.
CPC ...... *H01L 27/3248* (2013.01); *H01L 27/3246* (2013.01); *H01L 27/3258* (2013.01); *H01L 51/0011* (2013.01); *H01L 51/5012* (2013.01); *H01L 51/5253* (2013.01); *H01L 51/56* (2013.01); *H01L 2227/323* (2013.01); *H01L 2251/558* (2013.01)

(58) Field of Classification Search
CPC ............. H01L 27/3248; H01L 27/3246; H01L 27/3258; H01L 51/0011; H01L 51/5012; H01L 51/5253; H01L 51/56
See application file for complete search history.

(56) References Cited

U.S. PATENT DOCUMENTS

| | | |
|---|---|---|
| 7,999,458 B2 | 8/2011 | Bae et al. |
| 8,664,673 B2 | 3/2014 | Irving et al. |

(Continued)

FOREIGN PATENT DOCUMENTS

| | | |
|---|---|---|
| KR | 10-2008-0061918 A | 7/2008 |
| WO | WO 2011/139771 A2 | 11/2011 |

*Primary Examiner* — Nicholas Tobergte
(74) *Attorney, Agent, or Firm* — Lee & Morse, P.C.

(57) ABSTRACT

An organic light emitting display panel and associated methods, the panel including a substrate; an organic light emitting diode (OLED) on the substrate; and an encapsulation member to separate the OLED from an external environment, wherein the OLED includes a first electrode on the substrate; a pixel defining layer exposing the first electrode and including a flat planar surface and an inclined planar surface extending from the flat planar surface such that the inclined planar surface overlaps an edge of the first electrode; an organic layer, the organic layer including a first region on the first electrode and a second region on the inclined planar surface; and a second electrode on the organic layer, and wherein, in the second region, a thickness of the organic layer is decreased along a direction extending away from the first region.

19 Claims, 7 Drawing Sheets

(56) References Cited

U.S. PATENT DOCUMENTS

| | | | |
|---|---|---|---|
| 8,846,301 B2 | 9/2014 | Ober et al. | |
| 2005/0116240 A1* | 6/2005 | Kim | H01L 27/3244 257/88 |
| 2013/0236999 A1 | 9/2013 | Lee et al. | |
| 2014/0070182 A1* | 3/2014 | Choi | H01L 51/52 257/40 |
| 2014/0127625 A1 | 5/2014 | Defranco et al. | |
| 2014/0131671 A1* | 5/2014 | Lee | H01L 51/0003 257/40 |
| 2014/0248565 A1 | 9/2014 | Defranco et al. | |
| 2014/0353595 A1* | 12/2014 | Choi | H01L 27/32 257/40 |
| 2015/0340413 A1* | 11/2015 | Lee | H01L 27/1251 257/40 |
| 2016/0197126 A1* | 7/2016 | Yoo | H01L 27/3246 257/40 |

* cited by examiner

ORGANIC LIGHT EMITTING DISPLAY PANEL AND METHOD OF MANUFACTURING THE SAME

CROSS-REFERENCE TO RELATED APPLICATION

Korean Patent Application No. 10-2015-0065454, filed on May 11, 2015, in the Korean Intellectual Property Office, and entitled: "Organic Light Emitting Display Panel and Method of Manufacturing the Same," is incorporated by reference herein in its entirety.

BACKGROUND

1. Field

Embodiments relate to an organic light emitting display panel and a method of manufacturing the same.

2. Description of the Related Art

Among flat plate display (FPD) panels, an organic light emitting display panel displays an image by using an organic light emitting diode (OLED) that generates light by recombination of electrons and holes. The organic light emitting display panel has a high response speed and is driven by low power consumption.

The OLED may include an anode electrode, an organic layer arranged on the anode electrode and including at least a light emitting layer, and a cathode electrode arranged on the organic layer. The organic layer may be commonly formed in a deposition process using a mask.

SUMMARY

Embodiments are directed to an organic light emitting display panel and a method of manufacturing the same.

The embodiments may be realized by providing an organic light emitting display panel including a substrate; an organic light emitting diode (OLED) on the substrate; and an encapsulation member to separate the OLED from an external environment, wherein the OLED includes a first electrode on the substrate; a pixel defining layer exposing the first electrode and including a flat planar surface and an inclined planar surface extending from the flat planar surface such that the inclined planar surface overlaps an edge of the first electrode; an organic layer, the organic layer including a first region on the first electrode and a second region on the inclined planar surface; and a second electrode on the organic layer, and wherein, in the second region, a thickness of the organic layer is decreased along a direction extending away from the first region.

An angle formed by the inclined planar surface and a surface of the second region of the organic layer may be about 15° to about 30°.

An angle formed by an extending surface of the first region of the organic layer and the surface of the second region of the organic layer may be 0° to about 15°.

A width of the second region of the organic layer may be about 1 μm or less.

The substrate may include a base substrate; and a thin film transistor (TFT) on the base substrate, wherein the TFT may be connected to the first electrode.

The organic light emitting display panel may further include a protective layer covering the TFT.

The embodiments may be realized by providing a method of manufacturing an organic light emitting display panel, the method including forming a first electrode on a substrate; forming a pixel defining layer such that the pixel defining layer exposes a portion of the first electrode and includes a flat planar surface and an inclined planar surface extending from the flat planar surface, the inclined planar surface overlapping an edge of the first electrode; forming a barrier on the flat planar surface such that the barrier exposes the inclined planar surface and the portion of the first electrode exposed by the pixel defining layer; forming an organic layer on the inclined planar surface and the portion of the first electrode that are exposed by the barrier; removing the barrier; and forming a second electrode on the organic layer, wherein the organic layer includes a first region on the first electrode; and a second region on the inclined planar surface, and wherein, in the second region of the organic layer, a thickness of the organic layer is decreased along a direction extending away from the first region of the organic layer.

Forming the barrier may include forming a photoresist layer by coating a fluorine-containing photoresist material; forming an insoluble region and a soluble region by exposing the photoresist layer; and removing the soluble region by using a fluorine-containing solvent.

The soluble region may overlie the inclined planar surface and the first electrode.

The photoresist layer may include at least one of fluorinated resorcinarene, fluorinated photoresist, fluorinated molecular glass photoresist, and a polymer including a fluorine-containing functional group and an acid-sensitive or radiation-sensitive functional group.

The fluorine-containing solvent may include at least one of methyl nonafluorobutyl ether, methyl nonafluoroisobutyl ether, isomeric mixtures of methyl nonafluorobutyl ether and methyl nonafluoroisobutyl ether, ethyl nonafluorobutyl ether, ethyl nonafluoroisobutyl ether, isomeric mixtures of ethyl nonafluorobutyl ether, ethyl nonafluoroisobutyl ether, 3-ethoxy-1,1,1,2,3,4,4,5,5,6,6,6-dodecafluoro-2-trifluoromethyl-hexane, and 1,1,1,2,2,3,4,5,5,5-decafluoro-3-methoxy-4-trifluoromethyl-pentane.

Removing the barrier may include processing the barrier with a solubility improver; and removing the barrier by using a fluorine-containing solvent.

The solubility improver may include a silazane-containing material.

An angle formed by the inclined planar surface and a surface of the second region of the organic layer may be about 15° to about 30°.

An angle formed by an extending surface of the first region of the organic layer and the surface of the second region of the organic layer may be 0° to about 15°.

A width of the second region of the organic layer may be about 1 μm or less.

The method may further include arranging an encapsulation member on the second electrode.

The method may further include forming a thin film transistor (TFT) on a base substrate before forming the first electrode, and connecting the TFT to the first electrode.

The method may further include forming a protective layer that covers the TFT.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
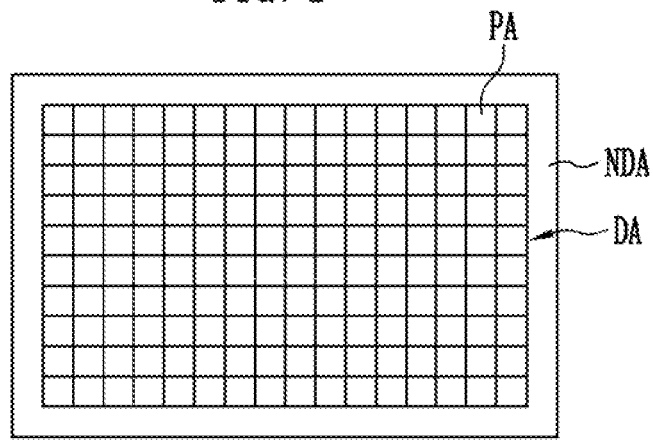
FIG. 1 illustrates a plan view of an organic light emitting display panel according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
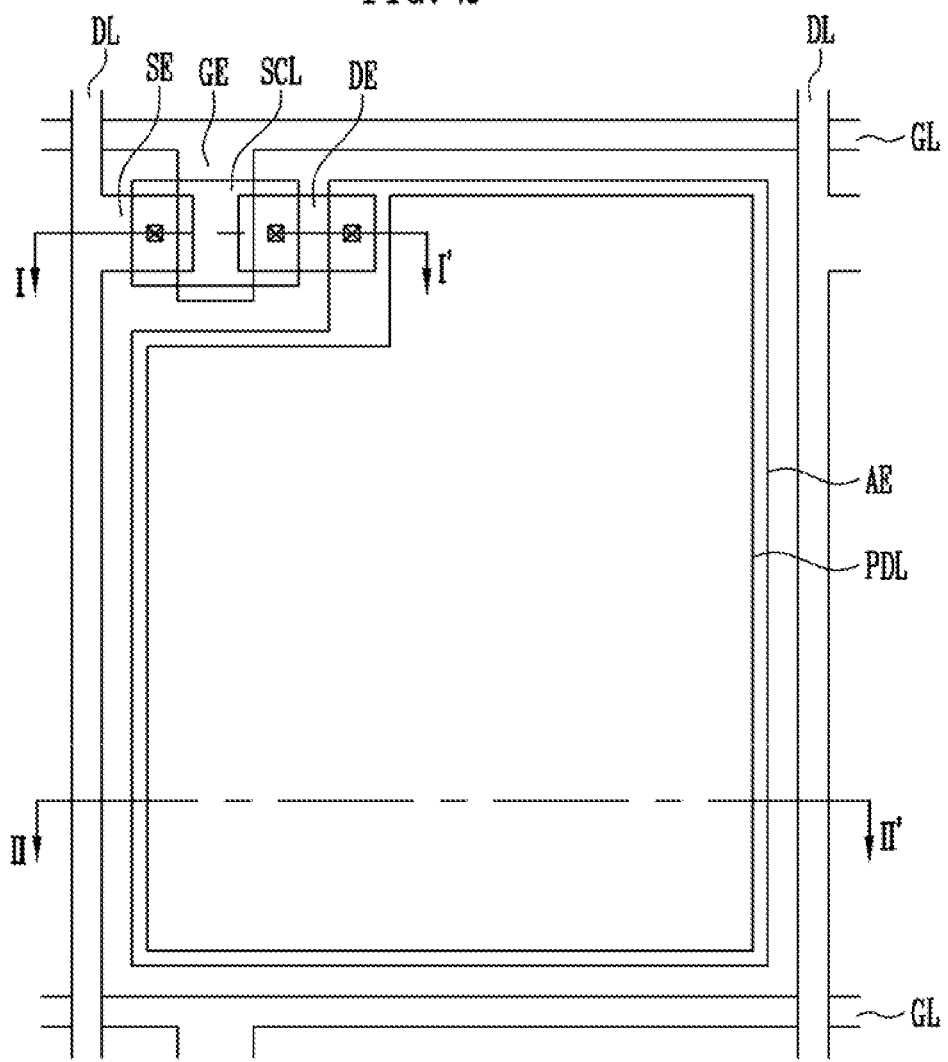
FIG. 2 illustrates a plan view of an enlarged pixel of the organic light emitting display panel of FIG. 1.
Figure 3:
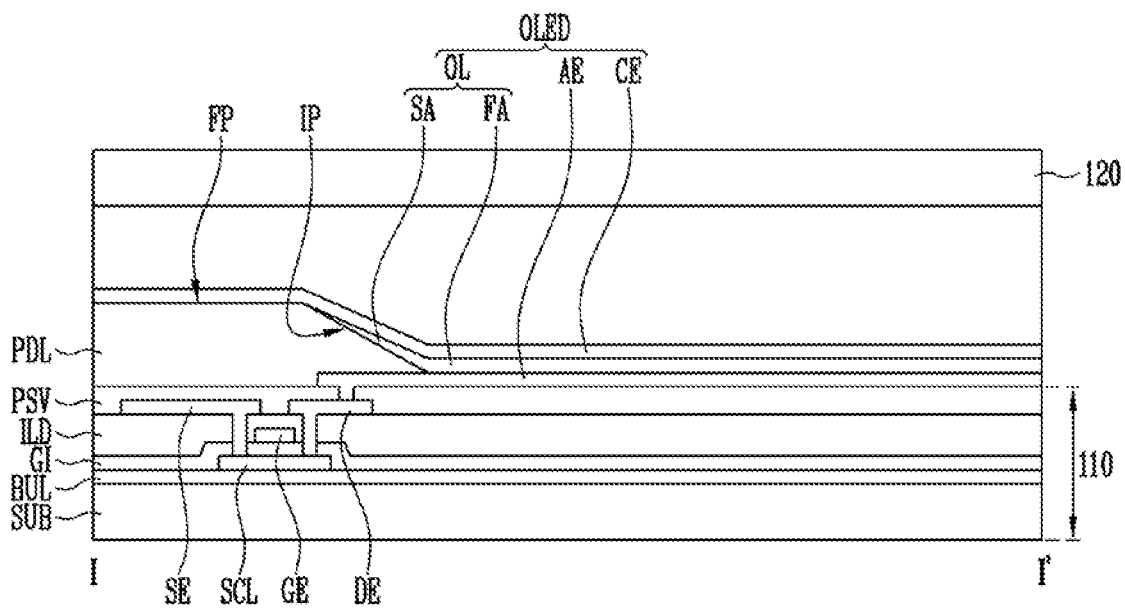
FIG. 3 illustrates a cross-sectional view taken along the line I-I' of FIG. 2.
Figure 4:
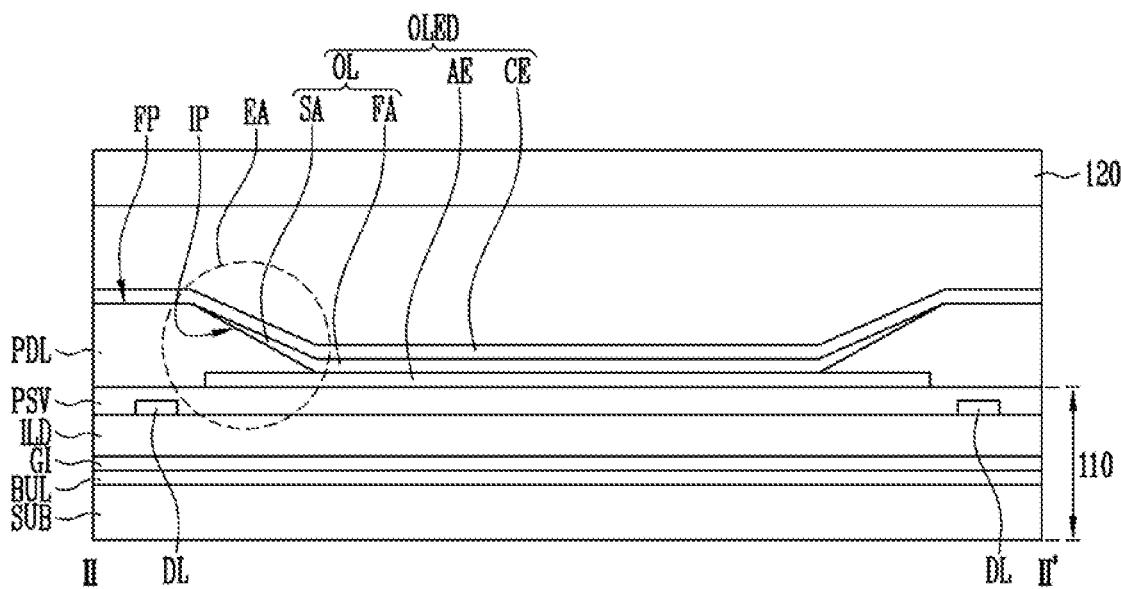
FIG. 4 illustrates a cross-sectional view taken along the line II-II' of FIG. 2.
Figure 5:
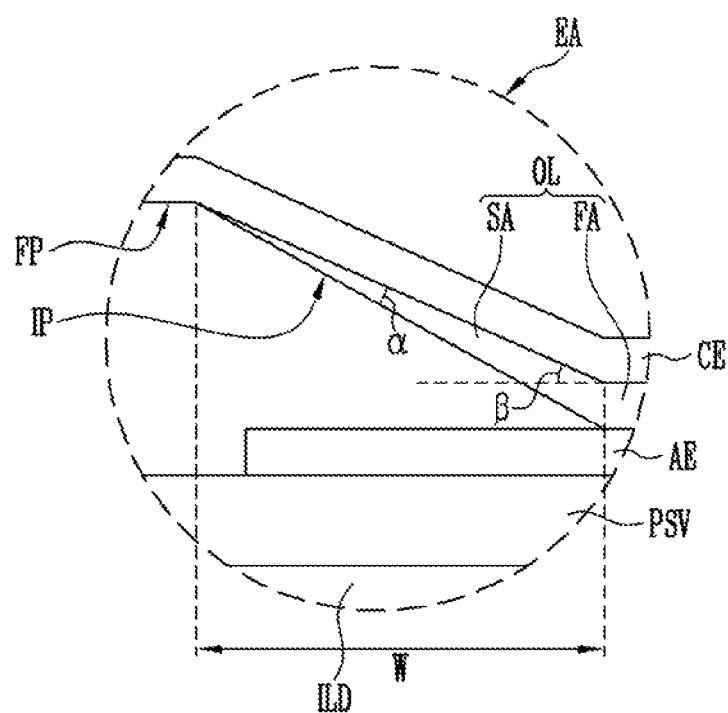
FIG. 5 illustrates an enlarged view of the EA region of FIG. 4.

FIG. 1 illustrates a plan view of an organic light emitting display panel according to an embodiment. FIG. 2 illustrates a plan view of an enlarged pixel of the organic light emitting display panel of FIG. 1. FIG. 3 illustrates a cross-sectional view taken along the line I-I' of FIG. 2. FIG. 4 illustrates a cross-sectional view taken along the line II-II' of FIG. 2. FIG. 5 illustrates an enlarged view of the EA region of FIG. 4.

Referring to FIGS. 1 to 5, the organic light emitting display panel may include a display region DA that displays an image and a non-display region NDA adjacent to the display region DA. The display region DA may include a plurality of pixel regions PA and light emitted from the different pixel regions PA may have different colors. For example, light emitted from the different pixel regions PA may have a color selected from red, green, blue, cyan, magenta, or yellow.

The organic light emitting display panel may include a first substrate 110, an organic light emitting diode (OLED) arranged on the first substrate 110, and an encapsulation member 120 for covering the OLED.

The first substrate 110 may include a base substrate SUB and at least one thin film transistor (TFT) arranged on the base substrate SUB.

The base substrate SUB may include a transparent insulating material and may transmit light. In an implementation, the base substrate SUB may be a rigid substrate or a flexible substrate. The rigid substrate may include a glass substrate, a quartz substrate, a glass ceramic substrate, or a crystalline glass substrate. The flexible substrate may include a film substrate and a plastic substrate including a polymer organic material. For example, the flexible substrate may include polyethersulfone (PES), polyacrylate, polyetherimide (PEI), polyethyelenen naphthalate (PEN), polyethylene terephthalate (PET), polyphenylene pulfide (PPS), polyarylate (PAR), polyimide (PI), polycarbonate (PC), triacetate cellulose (TAC), or cellulose acetate propionate (CAP).

In an implementation, a material used for the base substrate SUB may have resistance (or thermal resistance) against a high processing temperature during manufacturing processes.

A buffer layer BUL may be arranged between the base substrate SUB and the TFT. The buffer layer BUL may include at least one of $SiO_x$ and $SiN_x$. The buffer layer BUL may help reduce the possibility of and/or prevent moisture and oxygen from permeating into a semiconductor layer SCL of the TFT. The buffer layer BUL may help prevent impurities from being diffused from the base substrate SUB to the semiconductor layer SCL. In addition, the buffer layer BUL may planarize a surface of the base substrate SUB.

The TFT may be connected to a gate line GL and a data line DL. The TFT may include the semiconductor layer SCL, a gate electrode GE, a source electrode SE, and a drain electrode DE.

The semiconductor layer SCL may be arranged on the buffer layer BUL. The semiconductor layer SCL may include amorphous silicon (a-Si), poly Si, oxide semiconductor, or organic semiconductor. In the semiconductor layer SCL, a region connected to the source electrode SE and the drain electrode DE may be a source region and a drain region that are doped or injected with impurities. A region between the source region and the drain region may be a channel region. In an implementation, the oxide semiconductor may include at least one among zinc (Zn), indium (In), gallium (Ga), tint (Sn), or a mixture of the above. For example, the oxide semiconductor may include In—Ga—Zn oxide (IGZO).

In an implementation, when the semiconductor layer SCL includes the oxide semiconductor, a light shielding layer for shielding light received to the semiconductor layer SCL may be arranged on or under the semiconductor layer SCL.

A gate insulating layer GI may be arranged on the semiconductor layer SCL. The gate insulating layer GI may cover the semiconductor layer SCL and may insulate the semiconductor layer SCL and the gate electrode GE from each other. The gate insulating layer GI may include, e.g., at least one of $SiO_x$ and $SiN_x$.

The gate electrode GE may be arranged on the gate insulating layer GI. The gate electrode GE may be connected to the gate line GL. For example, the gate electrode GE may have a shape in which a part of the gate line GL protrudes. The gate electrode GE may overlap the semiconductor layer SCL. The gate electrode GE may include a low resistance conductive material. For example, the gate electrode GE may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), or an alloy of the above.

An interlayer dielectric layer ILD may be arranged on the gate electrode GE. The interlayer dielectric layer ILD may include the same material as the gate insulating layer GI. For example, the interlayer dielectric layer ILD may include at least one of $SiO_x$ and $SiN_x$.

The source electrode SE and the drain electrode DE may be separately arranged on the interlayer dielectric layer ILD. The source electrode SE and the drain electrode DE may include a low resistance conductive material. The source electrode SE and the drain electrode DE may be insulated from the gate electrode GE by the interlayer dielectric layer ILD. In addition, the source electrode SE and the drain electrode DE may be respectively connected to the source region and the drain region. The source electrode SE may be connected to the data line DL. For example, the source electrode SE may have a shape in which a part of the data line DL protrudes.

In an implementation, the TFT may have a top gate structure or may have a bottom gate structure.

A protective layer PSV may be arranged on the base substrate SUB on which the TFT is arranged. For example, the protective layer PSV may cover the TFT. In an implementation, a part of the protective layer PSV may be removed so that a part of the drain electrode DE may be exposed.

The protective layer PSV may include at least one layer. For example, the protective layer PSV may include an inorganic protective layer and an organic protective layer arranged on the inorganic protective layer. The inorganic protective layer may include at least one of $SiO_x$ and $SiN_x$. The organic protective layer may include at least one of acryl, polyimide (PI), polyamide (PA), and benzocyclobutene (BCB). In an implementation, the organic protective layer may be a transparent and flexible planarizing layer that may release and a curve of a lower structure and may planarize the lower structure.

The OLED connected to the drain electrode DE may be arranged on the protective layer PSV.

The OLED may include a first electrode AE connected to the drain electrode DE, an organic layer OL arranged on the first electrode AE, and a second electrode CE arranged on the organic layer OL.

One of the first electrode AE and the second electrode CE may be an anode electrode and the other may be a cathode electrode. For example, the first electrode AE may be the anode electrode and the second electrode CE may be the cathode electrode.

In an implementation, at least one of the first electrode AE and the second electrode CE may be a transmission type electrode. For example, when the OLED is a rear surface emission type OLED, the first electrode AE may be the transmission type electrode and the second electrode CE may be a reflection type electrode. In an implementation, when the OLED is a front surface emission type OLED, the first electrode AE may be the reflection type electrode and the second electrode CE may be a transmission type electrode. In an implementation, when the OLED is a both surface emission type OLED, both the first electrode AE and the second electrode CE may be the transmission type electrodes. According to the current embodiment, the case in which the OLED is the rear surface emission type OLED will be described.

The first electrode AE may be arranged on the protective layer PSV and may include a transparent conductive oxide. For example, the first electrode AE may include indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (FTO).

A pixel defining layer PDL may be arranged on the first electrode AE. The pixel defining layer PDL may expose (e.g., a portion of) the first electrode AE. The pixel defining layer PDL may include a flat planar surface FP and an inclined planar surface IP that extends from the flat planar surface FP. For example, the flat planar surface FP may be a horizontal planar surface that is substantially parallel with a plane of the base substrate SUB. The inclined planar surface IP may overlap an edge region of the first electrode AE.

The pixel defining layer PDL may include an organic insulating material. For example, the pixel defining layer PDL may include at least one of polystylene, polymethylmethacrylate (PMMA), polyacrylonitrile (PAN), polyamide (PA), polyimide (PI), polyarylether (PAE), heterocyclic polymer, Parylene, epoxy resin, benzocyclobutene (BCB), siloxane based resin, and silane based resin.

The organic layer OL may have a multilayer thin film structure including a light emitting layer EML. For example, the organic layer OL may include a hole injection layer (HIL) for injecting holes, a hole transport layer (HTL) having high hole transport property for blocking movement of electrons that are not combined in the light emitting layer EML and to increase a re-combination probability of holes and electrons, the light emitting layer EML that emits light by re-combination of the injected electrons and holes, a hole blocking layer (HBL) for blocking the movement of the holes that are not combined in the light emitting layer EML, an electron transport layer (ETL) for smoothly transporting electrons to the light emitting layer EML, and an electron injection layer (EIL) for injecting electrons. In an implementation, a color of the light generated by the light emitting layer EML may be one of red, green, blue, and white. In an implementation, the color of the light generated by the light emitting layer EML of the organic layer OL may be one of magenta, cyan, and yellow.

The organic layer OL may be arranged on the portion of first electrode AE (that is exposed by the pixel defining layer PDL) and the inclined planar surface IP of the pixel defining layer PDL. For example, the organic layer OL may include a first region FA on the first electrode AE and a second region SA on the inclined planar surface IP of the pixel defining layer PDL. In the first region FA, a thickness of the organic layer OL may be uniform. In the second region SA, the thickness of the organic layer OL may be reduced away from the first region FA. For example, the thickness of the organic layer in the second region SA may decrease (e.g., gradually decrease) in or along a direction extending away from the first region FA.

A magnitude of an angle α formed by the inclined planar surface IP and a (e.g., outer) surface of the second region SA may be about 15° to about 30°. A magnitude of an angle β formed by an extending surface of the first region FA (e.g., a plane extended from and coplanar with an upper or outer surface of the first region FA) and the (e.g., outer) surface of the second region SA may be 0° to about 15°. In an implementation, a width W of the second region SA may be no more than about 1 μm, e.g., may be greater than 0 μm and about 1 μm or less.

Maintaining the magnitude of the angle α formed by the inclined planar surface IP and the surface of the second region SA at about 15° or greater and the magnitude of the angle β formed by the extending surface of the first region FA and the surface of the second region SA at about 15° or less may help ensure that the width W of the second region SA is not larger than 1 μm. Maintaining the width W of the second region SA at about 1 μm or less may help ensure that the second region SA does not extend to be arranged on the flat planar surface FP and the inclined planar surface IP. For example, it may be desirable to prevent the width W of the second region SA from undesirably and excessively increasing. Therefore, in the pixel region PA, a ratio of a light emitting region of the OLED to an area of the organic layer OL may be reduced.

Maintaining the magnitude of the angle α formed by the inclined planar surface IP and the surface of the second region SA at about 30° or less may help ensure that a height of the second region SA is not smaller than that of the first region FA and that the width of the second region SA is not undesirably reduced. In addition, maintaining the magnitude of the angle α formed by the inclined planar surface IP and the surface of the second region SA at about 30° or less may help ensure that a distance between the first electrode AE and the second electrode CE is not undesirably reduced. Therefore, a short between the first electrode AE and the second electrode CE may be prevented.

The second electrode CE may be arranged on the organic layer OL. The second electrode CE may reflect light and may include a material having a lower work function than the first electrode AE. For example, the second electrode CE may include at least one of Mo, W, Ag, magnesium (Mg), Al, Pt, palladium (Pd), gold (Au), Ni, neodymium (Nd), iridium (Ir), Cr, lithium (Li), calcium (Ca), and an alloy of the above. Some of the light emitted from the organic layer OL may not be emitted in a direction of the first electrode AE and may be emitted in a direction of the second electrode CE. The light emitted in the direction of the second electrode CE may be reflected from the second electrode CE and may pass through the first electrode AE. In an implementation, a conductive layer for a voltage drop (IR drop) of the second electrode CE may be arranged on the second electrode CE.

The encapsulation member 120 may insulate the OLED from an external environment. In addition, the encapsulation member 120 may face the first substrate 110. In an implementation, the encapsulation member 120 may include the same material as the base substrate SUB. The encapsulation member 120 may adhere to the first substrate 110 through a sealant. In an implementation, the sealant may be arranged in the non-display region NDA.

In an implementation, a filler may be arranged in a space between the first substrate 110 and the encapsulation member 120. The filler may help prevent the OLED from being damaged by external shock. In an implementation, the filler may have moisture absorbing property, and the filler may absorb any moisture that may permeate into the OLED and may help prevent moisture from permeating into the OLED.

In an implementation, the encapsulation member 120 may be an encapsulation layer including a plurality of inorganic layers and a plurality of organic layers that cover the OLED. The encapsulation member 120 may be arranged on the second electrode CE and may help prevent, e.g., moisture and/or oxygen, from permeating into the OLED. The inorganic layer may include at least one or $SiO_x$, $SiN_x$, SiON, $Al_2O_3$, $TiO_2$, $ZrO_x$, and ZnO.

In the organic light emitting display panel, the organic layer OL may include the first region FA arranged on the first electrode AE (e.g., on the portions of the first electrode AE exposed by the pixel defining layer PDL) and the second region SA arranged on the inclined planar surface IP. The first region FA (arranged between the first electrode AE and the second electrode CE) may be a region that generates light when a power source is applied, e.g., the light emitting region. In an implementation, a thickness of the first region FA may be uniform, and it is possible to help prevent a difference in emission efficiency from being generated in accordance with a position in the light emitting region.

Hereinafter, referring to FIGS. 6 to 13, a method of manufacturing the organic light emitting display panel illustrated in FIGS. 1 to 5 will be described.

FIGS. 6 to 9 illustrate cross-sectional views of stages in a method taken along the line I-I' of FIG. 2. FIGS. 10 to 13 illustrate cross-sectional views of stages in a method taken along the line II-II' of FIG. 2.

Figure 6:
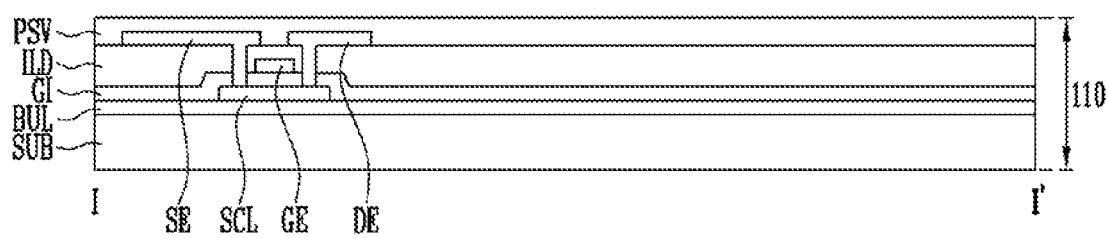
FIGS. 6 to 9 illustrate cross-sectional views of stages in a method taken along the line I-I' of FIG. 2.
Figure 10:
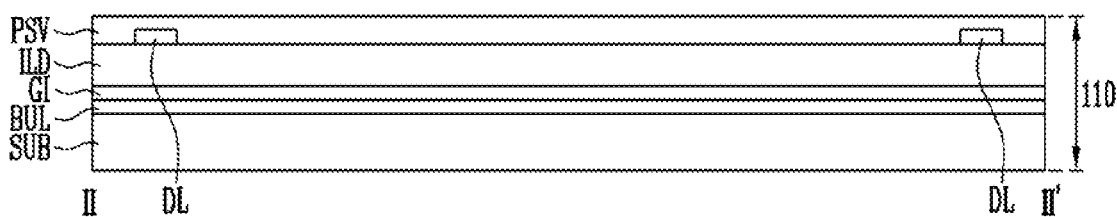
FIGS. 10 to 13 illustrate cross-sectional views of stages in a method taken along the line II-II' of FIG. 2.

Referring to FIGS. 6 and 10, the first substrate 110 may be manufactured by forming a TFT in each pixel region on the base substrate SUB.

For example, the first substrate 110 may be manufactured as follows.

First, the buffer layer BUL may be formed on the base substrate SUB. The base substrate SUB may include the display region DA and the non-display region NDA adjacent to the display region DA. The display region DA may include the plurality of pixel regions PA. In an implementation, the base substrate SUB may be the rigid substrate or the flexible substrate.

The buffer layer BUL may be formed by a deposition process, e.g., a plasma chemical vapor deposition (PCVD) process. In an implementation, the buffer layer BUL may include at least one of $SiO_x$ and $SiN_x$.

After forming the buffer layer BUL, in each pixel region PA, the TFT including the semiconductor layer SCL, the gate electrode GE, the source electrode SE, and the drain electrode DE may be formed on the buffer layer BUL.

The TFT may be formed as follows.

First, the semiconductor layer SCL may be formed on the buffer layer BUL. The semiconductor layer SCL may include one of, e.g., amorphous silicon (a-Si), poly Si, oxide semiconductor, and organic semiconductor.

After forming the semiconductor layer SCL, the gate insulating layer GI that covers the semiconductor layer SCL may be formed. The gate insulating layer GI may be formed by the deposition process, e.g., the PCVD process. In an implementation, the gate insulating layer GI may include, e.g., at least one of $SiO_x$ and $SiN_x$.

After forming the gate insulating layer GI, the gate line GL and the gate electrode GE may be formed on the gate insulating layer GI. The gate line GL and the gate electrode GE may be formed by forming a conductive layer including at least one of Al, Ag, W, Cu, Ni, Cr, Mo, Ti, Pt, Ta, Nd, Sc, and an alloy of the above, and patterning the conductive layer.

After forming the gate line GL and the gate electrode GE, the interlayer dielectric layer ILD may be formed. The interlayer dielectric layer ILD may cover the gate electrode GE. The interlayer dielectric layer ILD may include the same material as the gate insulating layer GI. For example, the interlayer dielectric layer ILD may include at least one of $SiO_x$ and $SiN_x$.

After forming the interlayer dielectric layer ILD, the interlayer dielectric layer ILD may be patterned so that a part of the semiconductor layer SCL is exposed. In the semiconductor layer SCL, the exposed region may be a source region and a drain region that contact the source electrode SE and the drain electrode DE that are formed later.

After patterning the interlayer dielectric layer ILD, the data line DL, the source electrode SE, and the drain electrode DE may be formed on the interlayer dielectric layer ILD. The source electrode SE and the drain electrode DE may be separated from each other and may be respectively connected to the source region and the drain region. In an implementation, the source electrode SE and the drain electrode DE may be formed by forming a conductive layer including a low resistance metal on the interlayer dielectric layer ILD and patterning the conductive layer.

After forming the TFT, the protective layer PSV that covers the TFT may be formed. The protective layer PSV may cover the TFT.

The protective layer PSV may include at least one layer. For example, the protective layer PSV may include an inorganic protective layer and an organic protective layer arranged on the inorganic protective layer. The inorganic protective layer may include at least one of $SiO_x$ and $SiN_x$. The organic protective layer may include at least one of acryl, PI, PA, and BCB. In an implementation, the organic protective layer may be a transparent and flexible planarizing layer that may release and a curve of a lower structure and may planarize the lower structure.

Figure 7:
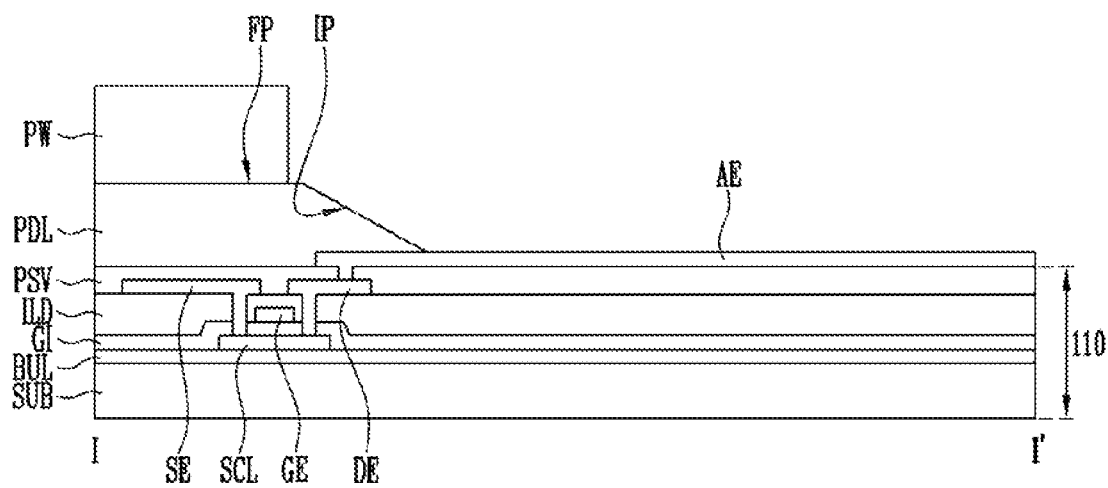
Figure 11:
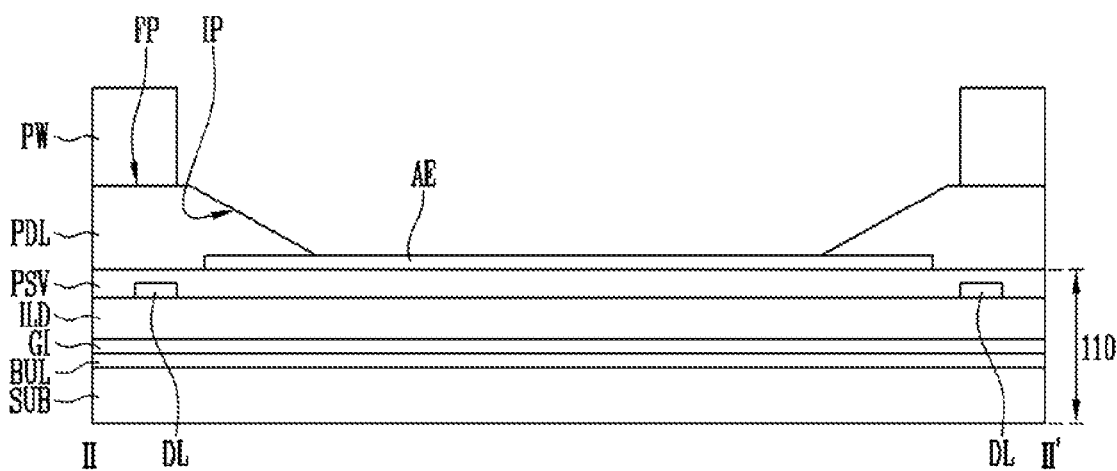

Referring to FIGS. 7 and 11, after forming the protective layer PSV, the protective layer PSV may be patterned so that a part of the drain electrode DE is exposed.

Then, the first electrode AE (connected to the drain electrode DE) may be formed on the protective layer PSV. The first electrode AE may be formed by forming a conductive layer including a transparent conductive oxide and patterning the conductive layer. The transparent conductive oxide may include, e.g., ITO, IZO, AZO, GZO, ZTO, GTO, or FTO.

After forming the first electrode AE, the pixel defining layer PDL (that exposes a part or portion of the first electrode AE) may be formed. The pixel defining layer PDL may be formed by forming an insulating layer including an organic insulating material on the first electrode AE and the protective layer PSV and patterning the insulating layer. The first electrode AE may be exposed by patterning the insulating layer. In an implementation, the pixel defining layer PDL may include a flat planar surface FP and an inclined planar surface IP that extends from the flat planar surface FP. The inclined planar surface IP may overlap or overlie an edge region of the first electrode AE.

After forming the pixel defining layer PDL, a sacrificial barrier PW may be formed on the flat planar surface FP of the pixel defining layer PDL. The barrier PW may expose the inclined planar surface IP and the first electrode AE.

In an implementation, the barrier PW may include a material that does not (e.g., adversely) affect organic materials included in the organic layer OL formed later.

The barrier PW may be formed as follows.

First, the pixel defining layer PDL and the first electrode AE may be coated with a fluoride or fluorine-based or fluoride or fluorine-containing photoresist material so that a photoresist layer is formed. For example, the photoresist layer may include at least one of fluorinated resorcinarene, fluorinated photoresist, fluorinated molecular glass photoresist, and polymer including a fluorine-containing functional group and an acid-sensitive or radiation-sensitive functional group. The fluorine-containing photoresist material may be dissolved in a fluoride or fluorine-based or fluoride or fluorine-containing solvent and may have low adhesiveness to a surface of a non-fluorine-based or non-fluorine-containing material.

After forming the photoresist layer, an exposure process may be performed. By the exposure process, the photoresist layer may be divided into an insoluble region and a soluble region. For example, the soluble region may correspond to or overlie the inclined planar surface IP and the first electrode AE.

Then, the soluble region may be removed so that the barrier PW is formed. Therefore, the barrier PW may be arranged on the flat planar surface FP.

The soluble region may be removed by using a fluoride or fluorine-based or fluoride or fluorine-containing solvent capable of dissolving the fluorine-containing photoresist material. The fluorine-containing solvent may include at least one of methyl nonafluorobutyl ether, methyl nonafluoroisobutyl ether, isomeric mixtures of methyl nonafluorobutyl ether and methyl nonafluoroisobutyl ether, ethyl nonafluorobutyl ether, ethyl nonafluoroisobutyl ether, isomeric mixtures of ethyl nonafluorobutyl ether, ethyl nonafluoroisobutyl ether, 3-ethoxy-1,1,1,2,3,4,4,5,5,6,6,6-dodecafluoro-2-trifluoromethyl-hexane, and 1,1,1,2,2,3,4,5,5,5-decafluoro-3-methoxy-4-trifluoromethyl-pentane. In an implementation, the fluorine-containing solvent may not be mixed with an organic solvent and water.

In an implementation, a height of the barrier PW may be about 0.5 μm to about 10 μm. Maintaining the height of the barrier PW at about 0.5 μm or greater may help ensure that, in a deposition process of the organic layer OL, the organic layer OL is not formed on the flat planar surface FP. Maintaining the height of the barrier PW at about 10 μm or less may help ensure that the thickness of the organic layer OL on the first electrode AE is uniform, e.g., that a shadow effect caused by the barrier PW is overcome.

Figure 8:
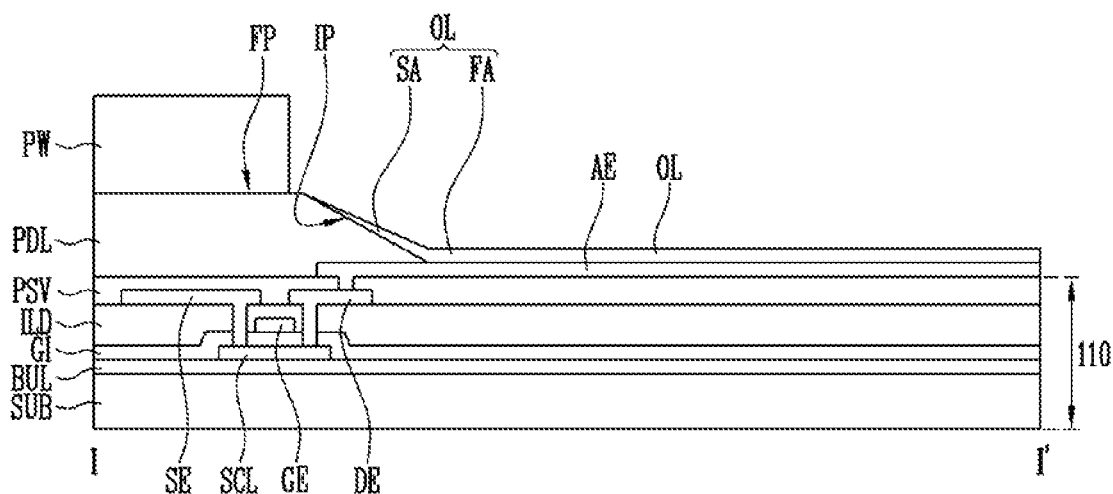
Figure 12:
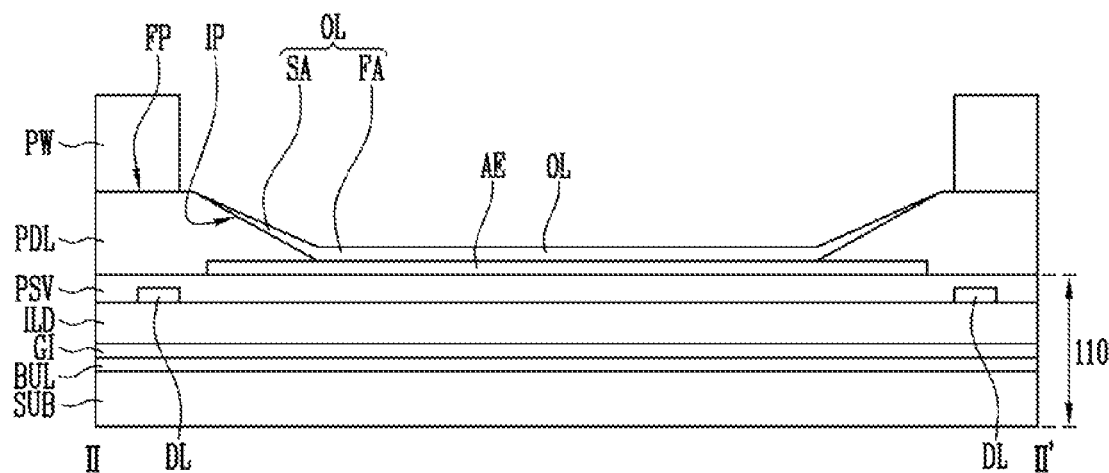

Referring to FIGS. 8 and 12, after forming the barrier PW, the organic layer OL may be formed in the region exposed by the barrier PW. The organic layer OL may include the first region FA (on the first electrode AE) and the second region SA (on the inclined planar surface IP of the pixel defining layer PDL).

The organic layer OL may be formed by a deposition process, e.g., a physical vapor deposition (PVD) process. In the PVD process, a deposition material included in a deposition source may be evaporated so that a material is deposited on a surface of a target. By performing the deposition process, the thickness of the organic layer OL may be uniform in the first region FA. In an implementation, due to the shadow effect caused by the barrier PW, in the second region SA, the thickness of the organic layer OL may be reduced in an direction extending away from the first region FA.

In an implementation, a magnitude of an angle α formed by the inclined planar surface IP of the pixel defining layer PDL and a surface of the second region SA may be about 15° to about 30°. In an implementation, a magnitude of an angle β formed by an extending surface of the first region FA and the surface of the second region SA may be 0° to about 15°. A width W of the second region SA may be about 1 μm or less.

In an implementation, the organic layer OL may have a multilayer thin film structure including the light emitting layer EML. For example, the organic layer OL may include a hole injection layer (HIL) for injecting holes, a hole transport layer (HTL) having high hole transport property for blocking movement of electrons that are not combined in the light emitting layer EML to increase a re-combination probability of holes and electrons, the light emitting layer EML that emits light by re-combination of the injected electrons and holes, a hole blocking layer (HBL) for blocking the movement of the holes that are not combined in the light emitting layer EML, an electron transport layer (ETL) for smoothly transporting electrons to the light emitting layer EML, and an electron injection layer (EIL) for injecting electrons. In an implementation, a color of the light generated by the light emitting layer EML may be one of red, green, blue, and white. In an implementation, the color of the light generated by the light emitting layer EML of the organic layer OL may be one of magenta, cyan, and yellow.

Figure 9:
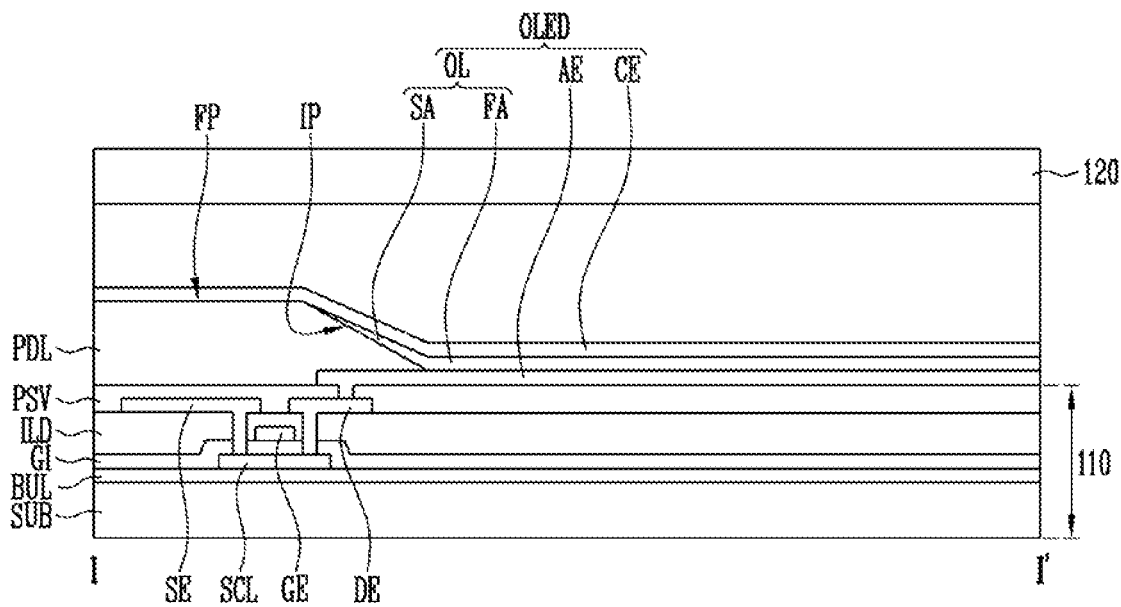
Figure 13:
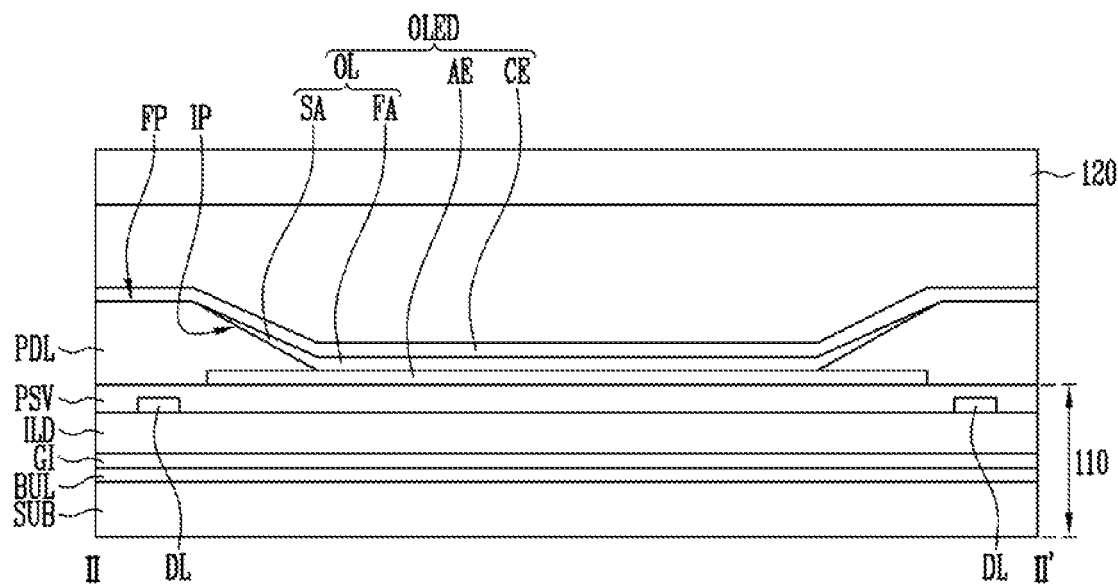

Referring to FIGS. 9 and 13, after forming the organic layer OL, the barrier PW may be removed.

A method of removing the barrier PW is as follows.

First, the barrier PW may be processed with a solubility improver so that the barrier PW may have solubility. The barrier PW may be dissolved in the fluorine-containing solvent like the soluble region by processing the barrier PW with the solubility improver. In an implementation, the solubility improver may include a silazane-based or silazane-containing material. For example, the solubility improver may include at least one of 1,1,1,3,3,3-hexamethyldisilazane and 1,1,3,3-tetramethyldisilazane.

After processing the barrier PW with the solubility improver, the barrier PW may be removed by using the fluorine-containing solvent. Here, the fluorine-containing solvent may be the same material as the fluorine-containing solvent used for removing the soluble region.

In an implementation, the process of forming the barrier PW, the process of forming the organic layer OL, and the process of removing the barrier PW may be repeatedly performed. For example, the organic light emitting display panel may include red, green, and blue pixel regions and the organic layer OL may be formed in the order of the red pixel region, the green pixel region, and the blue pixel region. The organic layer OL of each pixel region may be formed by the process of forming the barrier PW, the process of forming the organic layer OL, and the process of removing the barrier PW.

After removing the barrier PW, the second electrode CE may be formed on the organic layer OL so that the OLED including the first electrode AE, the organic layer OL, and the second electrode CE is formed. Here, the second electrode CE may reflect light and may be formed by depositing a material having a lower work function than the first electrode AE on the second electrode CE. For example, the second electrode CE may include at least one of Mo, W, Ag, Mg, Al, Pt, Pd, Au, Ni, Nd, Ir, Cr, Li, Ca, and an alloy of the above.

After forming the second electrode CE, the encapsulation member 120 (separating the OLED from an external environment and arranged on the second electrode CE) may be formed.

The encapsulation member 120 may face the first substrate 110. When the encapsulation member 120 faces the first substrate 110, the encapsulation member 120 may adhere to the first substrate 110 through a sealant. Here, the sealant may be arranged in the non-display region NDA.

In an implementation, when the encapsulation member 120 faces the first substrate 110, a filler may be provided in a space between the first substrate 110 and the encapsulation member 120. The filler may help prevent the OLED from being damaged by external shock. In addition, the filler may have moisture absorbing property, and the filler may absorb moisture that permeates into the OLED and may help prevent moisture from permeating into the OLED.

In an implementation, the encapsulation member 120 may be an encapsulation layer including a plurality of inorganic layers and a plurality of organic layers that cover the OLED. The encapsulation member 120 may be arranged on the second electrode CE and may help prevent moisture and oxygen from permeating into the OLED. The inorganic layer may include at least one of $SiO_x$, $SiN_x$, SiON, $Al_2O_3$, $TiO_2$, $ZrO_x$, and ZnO.

In the above-described method of manufacturing the organic light emitting display panel, the organic layer OL may be correctly arranged in each pixel region PA by using the barrier PW without using a mask. For example, it is possible to prevent the organic layer OL from being erroneously arranged.

The embodiments may provide an organic light emitting display panel including an organic layer having a uniform thickness between an anode electrode and a cathode electrode.

The embodiments may provide a method of manufacturing an organic light emitting display panel capable of preventing an organic layer from being erroneously arranged.

In the above-described organic light emitting display panel, the thickness of the organic layer between the first electrode and the second electrode may be uniform. For example, if the thickness of the organic layer were to be non-uniform, a difference in emission efficiency could be generated in accordance with a position in a pixel region. In the organic light emitting display panel according to an embodiment, it is possible to prevent the difference in emission efficiency from being generated in accordance with the position in the pixel region.

In addition, in the method of manufacturing the organic light emitting display panel according to an embodiment, the organic layer may be correctly arranged in the pixel region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display panel, comprising:
a substrate;
an organic light emitting diode (OLED) on the substrate; and
an encapsulation member to separate the OLED from an external environment,
wherein the OLED includes:
a first electrode on the substrate;
a pixel defining layer exposing the first electrode and including a flat planar surface and an inclined planar surface extending from the flat planar surface such that the inclined planar surface overlaps an edge of the first electrode;
an organic layer, the organic layer including a first region on the first electrode and a second region on the inclined planar surface; and
a second electrode on the organic layer, and
wherein, in the second region, a thickness of the organic layer is decreased along a direction extending away from the first region.

2. The organic light emitting display panel as claimed in claim 1, wherein an angle formed by the inclined planar surface and a surface of the second region of the organic layer is about 15° to about 30°.

3. The organic light emitting display panel as claimed in claim 2, wherein an angle formed by an extending surface of the first region of the organic layer and the surface of the second region of the organic layer is 0° to about 15°.

4. The organic light emitting display panel as claimed in claim 1, wherein a width of the second region of the organic layer is about 1 μm or less.

5. The organic light emitting display panel as claimed in claim 1,
wherein the substrate includes:
a base substrate; and
a thin film transistor (TFT) on the base substrate,
wherein the TFT is connected to the first electrode.

6. The organic light emitting display panel as claimed in claim 5, further comprising a protective layer covering the TFT.

7. A method of manufacturing an organic light emitting display panel, the method comprising:
   forming a first electrode on a substrate;
   forming a pixel defining layer such that the pixel defining layer exposes a portion of the first electrode and includes a flat planar surface and an inclined planar surface extending from the flat planar surface, the inclined planar surface overlapping an edge of the first electrode;
   forming a barrier on the flat planar surface such that the barrier exposes the inclined planar surface and the portion of the first electrode exposed by the pixel defining layer;
   forming an organic layer on the inclined planar surface and the portion of the first electrode that are exposed by the barrier;
   removing the barrier; and
   forming a second electrode on the organic layer,
   wherein the organic layer includes:
      a first region on the first electrode; and
      a second region on the inclined planar surface, and
   wherein, in the second region of the organic layer, a thickness of the organic layer is decreased along a direction extending away from the first region of the organic layer.

8. The method as claimed in claim 7, wherein forming the barrier includes:
   forming a photoresist layer by coating a fluorine-containing photoresist material;
   forming an insoluble region and a soluble region by exposing the photoresist layer; and
   removing the soluble region by using a fluorine-containing solvent.

9. The method as claimed in claim 8, wherein the soluble region overlies the inclined planar surface and the first electrode.

10. The method as claimed in claim 8, wherein the photoresist layer includes at least one of fluorinated resorcinarene, fluorinated photoresist, fluorinated molecular glass photoresist, and a polymer including a fluorine-containing functional group and an acid-sensitive or radiation-sensitive functional group.

11. The method as claimed in claim 8, wherein the fluorine-containing solvent includes at least one of methyl nonafluorobutyl ether, methyl nonafluoroisobutyl ether, isomeric mixtures of methyl nonafluorobutyl ether and methyl nonafluoroisobutyl ether, ethyl nonafluorobutyl ether, ethyl nonafluoroisobutyl ether, isomeric mixtures of ethyl nonafluorobutyl ether, ethyl nonafluoroisobutyl ether, 3-ethoxy-1,1,1,2,3,4,4,5,5,6,6,6-dodecafluoro-2-trifluoromethyl-hexane, and 1,1,1,2,2,3,4,5,5,5-decafluoro-3-methoxy-4-trifluoromethyl-pentane.

12. The method as claimed in claim 7, wherein removing the barrier includes:
   processing the barrier with a solubility improver; and
   removing the barrier by using a fluorine-containing solvent.

13. The method as claimed in claim 12, wherein the solubility improver includes a silazane-containing material.

14. The method as claimed in claim 7, wherein an angle formed by the inclined planar surface and a surface of the second region of the organic layer is about 15° to about 30°.

15. The method as claimed in claim 14, wherein an angle formed by an extending surface of the first region of the organic layer and the surface of the second region of the organic layer is 0° to about 15°.

16. The method as claimed in claim 7, wherein a width of the second region of the organic layer is about 1 μm or less.

17. The method as claimed in claim 7, further comprising arranging an encapsulation member on the second electrode.

18. The method as claimed in claim 7, further comprising:
   forming a thin film transistor (TFT) on a base substrate before forming the first electrode, and
   connecting the TFT to the first electrode.

19. The method as claimed in claim 18, further comprising forming a protective layer that covers the TFT.

* * * * *